(12) United States Patent
Miyauchi (10) Patent No.: US 7,745,914 B2
(45) Date of Patent: *Jun. 29, 2010

(54) PACKAGE FOR RECEIVING ELECTRONIC PARTS, AND ELECTRONIC DEVICE AND MOUNTING STRUCTURE THEREOF

(75) Inventor: Masahiko Miyauchi, Kirishima (JP)

(73) Assignee: Kyocera Corporation, Kyoto (JP)

( * ) Notice: Subject to any disclaimer, the term of this patent is extended or adjusted under 35 U.S.C. 154(b) by 794 days.

This patent is subject to a terminal disclaimer.

(21) Appl. No.: 11/378,859

(22) Filed: Mar. 17, 2006

(65) Prior Publication Data

US 2006/0249835 A1 Nov. 9, 2006

(30) Foreign Application Priority Data

Mar. 22, 2005 (JP) ............... 2005-081464
May 27, 2005 (JP) ............... 2005-155866

(51) Int. Cl.
*H01L 23/495* (2006.01)

(52) U.S. Cl. ............... 257/675; 257/706; 257/712; 257/796; 257/E33.075

(58) Field of Classification Search ............... 257/675, 257/706, 707, 712–714, 717–718, 720, 722, 257/796, E33.075, E31.131, E23.051
See application file for complete search history.

(56) References Cited

U.S. PATENT DOCUMENTS

| 5,311,060 | A | * | 5/1994 | Rostoker et al. | ............ 257/796 |
| 5,367,196 | A | * | 11/1994 | Mahulikar et al. | .......... 257/787 |
| 5,959,356 | A | * | 9/1999 | Oh | .............................. 257/738 |
| 6,921,971 | B2 | * | 7/2005 | Basho et al. | ................. 257/706 |
| 2006/0172465 | A1 | * | 8/2006 | Brennan et al. | ............. 438/122 |

FOREIGN PATENT DOCUMENTS

| JP | 04-348062 | 3/1992 |
| JP | 6-334074 | 12/1994 |
| JP | 9-45828 | 2/1997 |

* cited by examiner

*Primary Examiner*—Hoa B Trinh
(74) *Attorney, Agent, or Firm*—Volpe and Koenig, P.C.

(57) ABSTRACT

A package for receiving electronic part has a heat radiating plate having a mounting area where the electronic part is mounted at a center portion of one main surface, a frame body adhered to the one main surface to surround the mounting area, and a wiring conductor derived from the inside to the outside of the frame body. The heat radiating plate has a metallic base body, a metallic body filling inside of the metallic base body, and a metal layer deposited on the metallic base body and the metallic body. The mounting area is formed on the metal layer so as to be located above the metallic body, both of the metallic body and the metal layer have higher thermal conductivity than the metallic body, and both of the frame body and the metallic base body have a smaller coefficient of thermal expansion than the metal layer.

10 Claims, 5 Drawing Sheets

PACKAGE FOR RECEIVING ELECTRONIC PARTS, AND ELECTRONIC DEVICE AND MOUNTING STRUCTURE THEREOF

BACKGROUND OF THE INVENTION

1. The Field of the Invention

The present invention relates to a package for receiving an electronic part with a heat radiating structure having good heat radiating property, an electronic device using the same, and a mounting structure of the electronic device.

2. Description of Prior Art

In the related art, a package for receiving an electronic part such as semiconductor elements, generally includes a frame body formed of an electrical insulating material such as aluminum oxide sintered material, mullite sintered material, glass ceramic sintered material, and the like, a heat radiating plate formed of copper-tungsten material or copper-molybdenum material for effectively radiating heat generated from operation of the mounted electronic part to outside or into the air, and a cover body. The frame body is disposed on one main surface of the heat radiating plate so as to surround the mounting area of the electronic part. In addition, a plurality of wiring conductors made of tungsten, molybdenum, manganese, copper, silver, and the like, is adhered to the frame body and is derived from inside of the concave part, which is formed by the frame body and the heat radiating plate to the outer surface.

The electronic part is securely adhered to the mounting area of the one main surface of the heat radiating plate through an adhesive agent such as glass, resin, lead, and the like. Respective electrodes of the electronic part are electrically connected to the wiring conductors via bonding wires. Next, the cover body is joined to the frame body through a sealing material made of glass, resin, lead, and the like. The electronic part is received in a container consisting of the heat radiating plate, the frame body, and the cover body, to thus form an electronic device as a product. The electronic device may be mounted on an external heat radiating member by means of screw to further increase heat radiation efficiency.

The package for receiving the electronic part, having the heat radiating plate made of the copper-tungsten material or the copper-molybdenum material, has the heat radiating plate with high thermal conductivity. A coefficient of thermal expansion of the heat radiating plate approximates a coefficient of thermal expansion of silicon and gallium arsenide constituting the electronic part, or a ceramic material constituting the package. Thus, such a package is attracting attention as a package for receiving high exothermic electronic part such as a power IC or a high frequency transistor.

The related art is disclosed in Japanese Patent Laid-open No. H04-348062.

Recently, in response to the increased value of heat generated in accordance with high integration of the power IC or the high frequency transistor, the heat radiating plate is desired to have thermal conductivity value of 300 W/m·K or more. However, thermal conductivity of the conventional heat radiating plate consisting of the copper-tungsten material or the copper-molybdenum material is about 200 W/m·K, which is lower than the desired thermal conductivity. Therefore, the heat radiating property is becoming insufficient.

Meanwhile, thermal conductivity can be increased by raising content of copper in the copper-tungsten material or the copper-molybdenum material of the related art. Yet, in this case, difference of coefficients of thermal expansion between the electronic part and the heat radiating plate is increased and thus it is impossible to securely bond the electronic part onto the heat radiating plate.

SUMMARY OF THE INVENTION

The present invention has been provided to solve the above-mentioned and other problems and disadvantages occurring in the conventional art, and an object of the present invention is to provide a package for receiving an electronic part, for well diffusing heat generated from the electronic part to outside or into the air and for securely adhering the electronic part to a heat radiating plate, an electronic device using the same, and a mounting structure of the electronic device.

A package for receiving electronic part comprises a heat radiating plate having a mounting area where the electronic part is mounted at a center portion of one main surface, a flame body adhered to the one main surface so as to surround the mounting area, and a wiring conductor derived from the inside to the outside of the frame body. The heat radiating plate comprises a metallic base body in a frame shape, a metallic body filling inside of the metallic base body, and a metal layer deposited on the metallic base body and the: metallic body. The mounting area is formed on the metal layer so as to be located above the metallic body, both of the metallic body and the metal layer have higher thermal conductivity than the metallic base body, and both of the frame body and the metallic base body have a smaller coefficient of thermal expansion than the metal layer.

Preferably, the coefficient of thermal expansion of the frame body is smaller than that of the metallic base body.

Preferably, thickness of the frame body is smaller than that of the metallic base body.

Preferably, the metal layer is interposed between the metallic base body and the frame body.

Preferably, a coefficient of thermal expansion of the frame body is 0.7~1.5 times as great as a coefficient of thermal expansion of the metallic base body.

Preferably, the metallic base body includes tungsten or molybdenum.

Preferably, the metallic body includes copper.

Preferably, the frame body is made of ceramic.

Preferably, arithmetic mean roughness Ra of a main surface of the metallic base body on opposite side of the metal layer is 30 μm or more (R≦30 μm).

A package for receiving electronic part comprises a heat radiating plate comprising a metallic base body in a frame shape, a metallic body filling inside of the metallic base body and having higher thermal conductivity than the metallic base body, a metal layer deposited on the metallic base body and the metallic body and having higher thermal conductivity than the metallic base body and a larger coefficient of thermal expansion than the metallic base body, and a mounting area on the metal layer corresponding to the metallic body for mounting the electronic part, a frame body adhered to the heat radiating plate so as to surround the mounting area with a smaller coefficient of thermal expansion than the metal layer, and a wiring conductor derived from the inside to the outside of the frame body.

An electronic device comprises electronic part, a package for receiving the electronic part, and a sealing member for sealing the electronic part. The package for receiving the electronic part comprises a heat radiating plate having a mounting area, at a center portion of one main surface, where the electronic part is mounted, a frame body adhered to the one main surface so as to surround the mounting area, and a wiring conductor derived from the inside to the outside of the frame body. The heat radiating plate comprises a metallic base body in a frame shape, a metallic body filling inside of the metallic base body, a metal layer deposited on the metallic base body and the metallic body. The mounting area is formed on the metal layer so as to be located above the metallic body, both the metallic body and the metal layer have higher thermal conductivity than the metallic base body, both the frame body and the metallic base body have a smaller coefficient of thermal expansion than the metal layer, and the electronic part is mounted on the mounting area and electrically connected with the wiring conductor.

Preferably, outer circumference of the metallic body is located outside of outer circumference of the electronic part when the heat radiating plate is viewed in a plane perspective.

Preferably, the electronic part is semiconductor elements.

An electronic device receiving electronic part comprises a heat radiating plate comprising a metallic base body in a frame shape, a metallic body filling inside of the metallic base body with higher thermal conductivity than the metallic base body, a metal layer deposited on the metallic base body and the metallic body and having higher thermal conductivity than the metallic base body and a larger coefficient of thermal expansion than the metallic base body, and a mounting area on the metal layer corresponding to the metallic body for mounting the electronic part, a frame body adhered to the heat radiating plate so as to surround the mounting area and having a smaller coefficient of thermal expansion than the metal layer, a wiring conductor derived from the inside to the outside of the frame body, electronic part mounted on the mounting area and electrically connected with the wiring conductor, and a sealing member for sealing the electronic part.

A mounting structure of an electronic device comprises a heat radiating member, and an electronic device is mounted on the heat radiating member. The electronic device comprises electronic part, a package for receiving the electronic part and a sealing member for sealing the electronic part. The heat radiating member comprises a metallic base body in a frame shape, a metallic body filling inside of the metallic base body, and a metal layer deposited on the metallic base body and the metallic body. The mounting area is formed on the metal layer so as to be located above the metallic body, both the metallic body and the metal layer have higher thermal conductivity than the metallic base body, both the frame body and the metallic base body have a smaller coefficient of thermal expansion than the metal layer, the electronic part is mounted on the mounting area and electrically connected with the wiring conductor, and the electronic deice is mounted on the heat radiating member such that respective main surfaces of the metallic base body and the metallic body on opposite side of the metal layer contact with the heat radiating member.

Preferably, a carbon sheet or grease is interposed between the main surface of the metallic body on opposite side of the metal layer, and the heat radiating member.

A mounting structure of an electronic device by mounting the electronic device on a heat radiating member, comprises a heat radiating plate comprising a metallic base body in a frame shape, a metallic body filling inside of the metallic base body and having higher thermal conductivity than the metallic base body, a metal layer deposited on the metallic base body and the metallic body and having higher thermal conductivity than the metallic base body and a larger coefficient of thermal expansion than the metallic base body, and a mounting area on the metal layer corresponding to the metallic body for mounting the electronic part, a frame body adhered to the heat radiating plate so as to surround the mounting area with a smaller coefficient of thermal expansion than the metal layer, a wiring conductor derived from the inside to the outside of the frame body, electronic part mounted on the mounting area and electrically connected with the wiring conductor, a sealing member for sealing the electronic part, and the heat radiating member in contact with respective main surfaces of the metallic base body and the metallic body on opposite side of the metal layer.

According to the present invention, a heat radiating plate constituting a package for receiving electronic part includes a metallic base body in a flame shape, a metallic body filling inside of the metallic base body, and a metal layer deposited on the metallic base body and the metallic body. A mounting area is formed on the metal layer so as to be located above the metallic body, both the metallic body and the metal layer have higher thermal conductivity than the metallic base body, and both the frame body and the metallic base body have a smaller coefficient of thermal expansion than the metal layer. Accordingly, more heat generated from the electronic part can be transferred in the direction vertical to the mounting surface of the electronic part owing to the metallic body and be effectively diffused into the air or to an external radiating member through the heat radiating plate.

Since the metal layer deposited on the metallic base body and having high thermal conductivity can aid to transfer more heat generated from the electronic part in the direction parallel to the mounting surface of the electronic part, the heat radiation can be further improved.

Furthermore, as the metal layer is interposed between the frame body and the metallic base body having a small coefficient of thermal expansion, thermal expansion of the heat radiating plate can be controlled successfully and stress on the heat radiating plate can be effectively blocked. Consequently, it is possible to effectively prevent crack from being generated on the frame body or the electronic part from being damaged when the stress is transferred to the frame body or the electronic part, and the electronic part can be operated properly and stably for a long term.

According to the present invention, a coefficient of thermal expansion of the frame body is smaller than that of the metallic base body. Thus, when the heat is transferred to the heat radiating plate by heat generation of the electronic part, the frame body having a smaller coefficient of thermal expansion than the metallic base body can restrict thermal expansion of the metallic base body toward the frame body. Then, the heat radiating plate becomes convex to the opposite side of the frame body, that is, is bent such that the center portion of the main surface of the heat radiating plate opposite to the frame body is protruded. Hence, the package for receiving the electronic part can be in contact with an external heat radiating member without a gap. Consequently, heat generated from the electronic part can be effectively transferred to the external heat radiating member through the heat radiating plate.

Preferably, thickness of the frame body is smaller than that of the metallic base body. Then, heat transfer from the electronic part to the heat radiating plate can be smoothly carried out, and the package for receiving the electronic part can be downsized by lowering its height.

According to the present invention, a package for receiving electronic part constituting an electronic device comprises a heat radiating plate having a mounting area where the electronic part is mounted at a center portion of one main surface, a frame body adhered to the one main surface so as to surround the mounting area, and a wiring conductor derived from the inside to the outside of the frame body. The heat radiating plate comprises a metallic base body in a frame shape, a metallic body filling inside of the metallic base body, and a metal layer deposited on the metallic base body and the metallic body. The mounting area is formed on the metal layer so as to be located above the metallic body, both the metallic body and the metal layer have higher thermal conductivity than the metallic base body, both the frame body and the metallic base body have a smaller coefficient of thermal expansion than the metal layer, and the electronic part is mounted on the mount area and electrically connected to the wiring conductor. Hence, the electronic device can operate the electronic part stably for a long term with excellent heat radiation for the electronic part.

According to the present invention, in the mounting structure of the electronic device, respective main surfaces of the metallic base body and the metallic body on opposite side of the metal layer of the above electronic device contact with the heat radiating member. Thus, since the heat generated from the electronic part can be smoothly transferred to the heat radiating member, heat radiation can be improved.

According to the present invention, a carbon sheet or grease is interposed between the main surface of the metallic body opposite to the metal layer and the heat radiating member. Thus, it is possible to effectively prevent a gap from being generated between the metallic body and the heat radiating member, to transfer heat generated from the electronic part to the heat radiating member far more efficiently, and to improve heat radiation reliability to the heat radiating member.

THE BRIEF DESCRIPTION OF THE DRAWINGS

These and/or other objects, aspects and advantages of the present invention will become apparent and more readily appreciated from the following description of the embodiments, taken in conjunction with the accompanying drawings.

DESCRIPTION OF THE PREFERRED EMBODIMENTS

Suitable embodiments of the present invention will now be described in detail with reference to the accompanying drawings.

Figure 1:
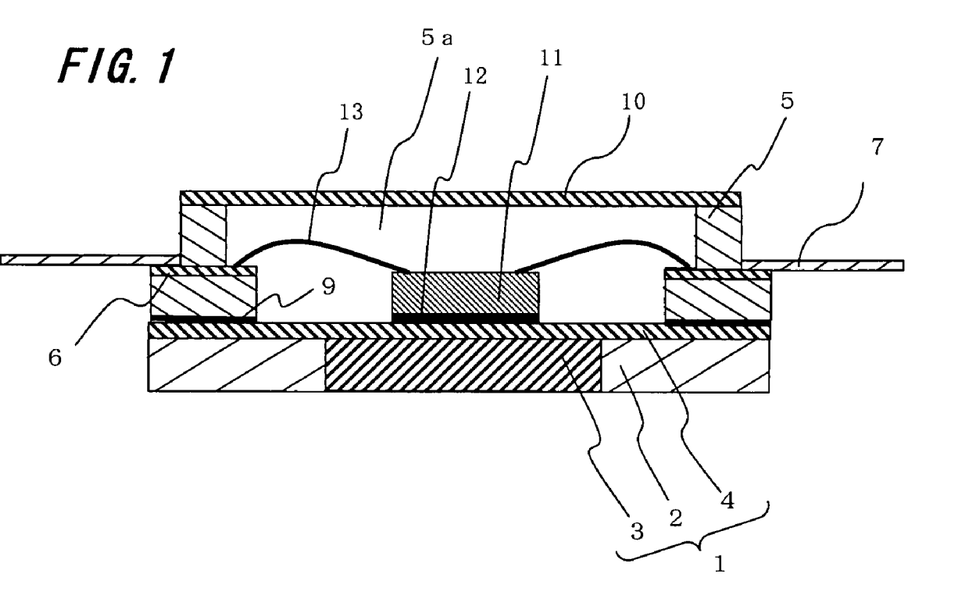
FIG. 1 is a cross sectional view illustrating a package for receiving electronic part and an electronic device according to the first embodiment of the present invention.
Figure 2:
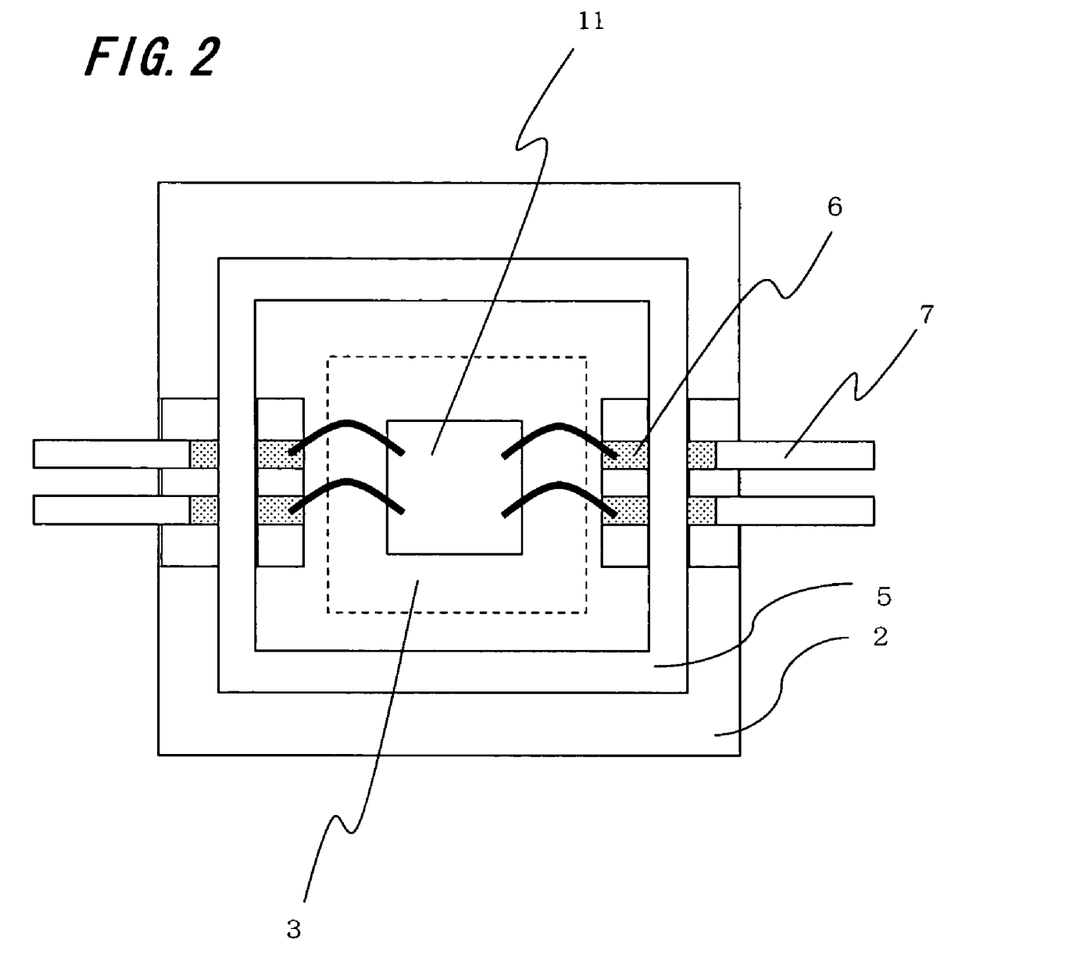
FIG. 2 is a plane perspective view of the package for receiving the electronic part of FIG. 1.
Figure 5:
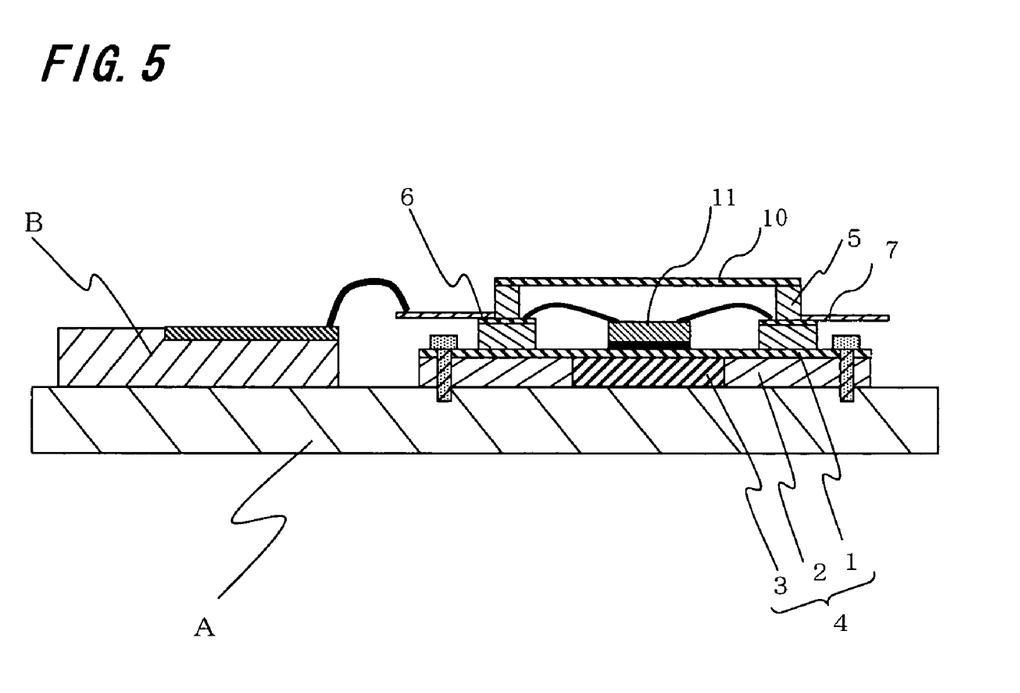
FIG. 5 is a cross sectional view illustrating a mounting structure of the electronic device according to the embodiments of the present invention.

FIG. 1 is a cross sectional view illustrating a package for receiving electronic part and an electronic device according to a first embodiment of the present invention. FIG. 2 is a plane perspective view of the package for receiving the electronic part of FIG. 1. The package for receiving the electronic part includes a heat radiating plate 1, a metallic base body 2, a metallic body 3, a metal layer 4, a frame body 5, a wiring conductor 6, a lead terminal 7, and a cover body 10. The heat radiating plate 1, the frame body 5, and the wiring conductor 6 configure a package for receiving electronic part 11. After the electronic part 11 is mounted on a mounting area 12 of the heat radiating plate 1, the cover body 10 is adhered over a concave part 5a, which is formed by the heat radiating plate 1 and the frame body 5, so as to cover the mounting area 12, and the electronic part 11 is sealed tightly. Thus, the electronic device of the present invention is formed. FIG. 5 is a cross sectional view showing a mounting structure of the electronic device, which is fabricated by mounting the electronic device on a heat radiating member A, according to an embodiment of the present invention.

The electronic part 11 is semiconductor elements represented by power IC, high frequency transistor, laser diode (LD), light emitting diode (LED), photo diode (PD), and the like, and includes electronic part which generates heat during its operation.

The frame body 5 is made of an insulting material such as aluminum oxide sintered material, mullite sintered material, and glass ceramic sintered material, or a metal such as Fe based alloy represented by Fe—Ni—Co alloy and Fe—Ni alloy. The frame body 5 is securely bonded on the one main surface of the heat radiating plate through a solder 9, to surround the mounting area 12. When securely boding the frame body 5 through the solder 9, a metal layer for general soldering (not shown) may be formed on the contact part between the frame body 5 and the heat radiating plate 1.

The electronic part 11 is secured on the mounting area 12 of the heat radiating plate 1, at the center of the one main surface, through an adhesive agent (not shown) such as resin, glass, or lead. If lead is used as an adhesive agent, the metal layer for soldering (not shown) may be formed on the contact part between the heat radiating plate 1 and the electronic part 11. Note that the metal layer for soldering is not necessary when it is possible to sufficiently solder the electronic part using the metal layer 4 bonded on the mounting area 12 of the one main surface of the heat radiating plate 1.

In case that the frame body 5 is made of the aluminum oxide sintered material by way of example, the frame body 5 is fabricated as follows. First, suitable organic binder, solvent agent, plasticizer, dispersant and so on are added to and mixed with a raw powder such as aluminum oxide, silicon oxide, magnesium oxide, and calcium oxide, to thus form a slip. A ceramic green sheet (ceramic raw sheet) is formed by transforming the slip into a sheet by use of a doctor blade method or a calendar roll method. Next, a suitable punching is conducted to the ceramic green sheet. A conductive paste, which is prepared by mixing a metallic powder such as tungsten, molybdenum, manganese, copper, silver, nickel, palladium, and gold with a suitable organic binder and the solvent agent, is printed and applied on the ceramic green sheet in a certain pattern using a screen printing. Next, a plurality of the ceramic green sheets is laminated and baked at about 1600° C.

The frame body 5 may be produced by press-punching a plate of Fe based alloy such as Fe—Ni—Co, in a die.

The frame body 5 has the wiring conductor 6 derived from the mounting area inside of the concave part 5a formed by the heat radiating plate 1 and the frame body 5, to the outer surface of the frame body 5. One end in the concave part 5a of the wiring conductor 6 is electrically connected with each electrode of the semiconductor element 11 via the bonding wire 13.

The wiring conductor 6 is formed of a metal having high melting point, such as tungsten and molybdenum. A metallic paste prepared by adding and mixing the metallic powder such as tungsten and molybdenum with the suitable organic binder, the solvent agent, and the like is printed and applied on the ceramic green sheet forming the frame body 5 in a certain pattern using a preset screen printing. Thus, the wiring conductor 6 is adhered and formed from the mounting area in the concave part 5*a* which is formed by the heat radiating plate 1 and the frame body 5, to the outer surface of the frame body 5.

When a metal, such as nickel and gold, having excellent corrosion resistance and high bonding property of the bonding wire 13 is deposited on the exposed surface of the wiring conductor 6 in the thickness of 1~20 μm according to a plating method, oxidation corrosion of the wiring conductor 6 can be effectively prevented and the connection of the bonding wire 13 to the wiring conductor 6 can be strong and firm. Accordingly, it is preferable to dispose a metal, such as nickel and gold, having excellent corrosion resistance and high bonding property on the exposed surface of the wiring conductor 6 in the thickness of 1~20 μm.

The wiring conductor 6 may be formed as a lead terminal consisting of Fe—Ni—Co, for example. In this case, a notch or a penetration hole is formed from the inside surface to the outside surface of the frame body 5, and the wiring conductor 6 can be formed by bonding the lead terminal via an adhesive material such as glass with the notch or the penetration hole. Alternatively, the notch or the penetration hole can be bonded with an I/O terminal having the wiring conductor 6 formed on the insulating material according to the well known metallization methods, thin film formation methods, and plating methods.

The heat radiating plate 1 of the present invention functions to absorb heat generated by operation of the electronic part 11 and to radiate the heat into the air, or to conduct the heat to the external radiating member A. The heat radiating plate 1 has the metal layer 4 having higher thermal conductivity than the metallic base body 2, which is laminated on the metallic base body 2 in a frame shape. Under the mounting area 12, the penetration hole of the metallic base body 2, which is formed in the inside from the internal surface of the frame body 5, is filled with the metallic body 3 having the higher thermal conductivity than the metallic base body 2. Coefficients of thermal expansion of the metallic base body 2 and the frame body 5 are set to smaller than that of the metal layer 4.

According to this structure, more heat generated from the electronic part 11 can be transferred in the direction vertical to the mounting surface of the electronic part 11 owing to the metallic body 3 and can be effectively radiated into the air or to the external heat radiating member A through the heat radiating plate 1.

Also, the metal layer 4 deposited on the metallic base body 2 and having high thermal conductivity can aid to transfer more heat generated from the electronic part 11 in the direction parallel to the mounting surface of the electronic part 11 and thus improve heat radiation.

Furthermore, by interposing the metal layer 4 between the frame body 5 and the metallic base body 2 having small coefficients of thermal expansion, thermal expansion of the heat radiating plate 1 can be prevented and stress on the heat radiating plate 1 can be blocked effectively. Consequently, it is possible to effectively prevent crack from being generated on the frame body 5 or the electronic part 11 from being damaged, when the stress is transferred to the frame body 5 or the electronic part 11, and the electronic part 11 can be operated properly and stably for a long term.

The metallic base body 2 having a coefficient of thermal expansion similar to the electronic part 11 or the frame body 5. For instance, as a material of the metallic base body 2, the metal such as tungsten or molybdenum is used. Alternatively, as a material of the metallic base body 2, a porous body obtained by pressing and molding the tungsten powder or the molybdenum powder and then sintering in the atmosphere of 1300~1600° C., through which copper is impregnated, that is, a copper-tungsten material or a copper-molybdenum material is used.

For the metal layer 4, a material having higher thermal conductivity than the frame body 5 or the metallic base body 2 is used. For instance, copper or various copper alloys having copper as a main ingredient, is employed as the metal layer 4. The metal layer 4 can be formed by joining the metal plate becoming the metal layer 4 to the metallic base body 2 using soldering or welding, or by depositing a metal becoming the molten metal layer 4 on the metallic base body 2.

A coefficient of thermal expansion of the metal layer 4 is 2.3~2.7 times as great as that of the frame body 5, and 2.0~2.4 times as great as that of the metallic base body 2. Thus, the stress to the heat radiating plate 1 can be effectively prevented by making the metal layer 4 interpose between the frame body 5 and the metallic base body 2 and restricting thermal expansion of the metal layer 4.

If the thickness of the metal layer 4 is over 800 μm, the sufficient joint strength is not acquired because of the large stress resulting from a thermal expansion difference between the metallic base body 2 and the metal layer 4. Hence, it is preferable to set the thickness of the metal layer 4 to 800 μm or less. If the thickness of the metal layer 4 is over 50 μm, the heat generated by the operation of the electronic part 11 is expanded in the plane direction of the metal layer 4 sufficiently. Thus, the heat radiation of the heat radiating plate 1 is far more improved.

As a material of the metallic body 3, a material having higher thermal conductivity than the metallic base body 2 is used. For instance, as material of the metallic body 3, the copper or the various copper alloys having the copper as the main ingredient is used. The metallic body 3 may be the same material as the metal layer 4, or the different material. The metallic body 3 is formed by, for example, inserting the metallic body 3 having the block shape into the penetration hole of the metallic base body 2 and soldering the metallic body 3 to the metallic base body 2. Alternatively, the metallic body 3 is formed by filling out the penetration hole of the metallic base body 2 with the molten metal. Otherwise, the metallic body 3 is formed by filling the penetration hole of the metallic base body 2 with the metal using the plating.

The heat radiating plate 1 is fabricated, by way of example, as follows. First, tungsten powder or molybdenum powder having a mean particle diameter of 5~40 μm is pressed and molded to form a penetration hole in the mounting area of the electronic part 11, and baked in the atmosphere of 1300~1600° C. As a result, the porous body is acquired. Next, the porous body is impregnated with copper of 10~50 W % at about 1200° C. in hydrogen atmosphere, to thus fabricate the metallic base body 2 in a plate shape with a copper-tungsten material or a copper-molybdenum material. Next, the metallic body 3 is buried by inserting and soldering a copper block into the penetration hole formed at the center of the metallic base body 2. Finally, the heat radiating plate 1 is fabricated by covering and joining the metal layer 4 over the metallic base body 2 and the metallic body 3.

The metallic body 3 may be fabricated by filling penetration hole with copper when the porous body in which tungsten powder or molybdenum powder is sintered, is impregnated with copper at the same time.

Preferably, outer circumference of the metallic body 3 lies outward from the outer circumference of the electronic part 11 in the plane perspective view. Especially, it is preferred that the outer circumference of the metallic body 3 lies outward from the outer circumference of the electronic part 11 by the thickness of the metallic base body 2. Accordingly, it is possible to transfer more heat generated by the electronic part 11 from the mounting area 12 of the electronic part 11 of the one main surface of the heat radiating plate 1 in the vertical direction with the other main surface, and to improve the heat radiation since the heat expands within the metallic body 3 from the outer circumference of the electronic part 11 to outward in the parallel direction with the heat radiating plate 1.

If the outer circumference of the metallic body 3 lies outward from the inner surface of the frame body 5, the mounting area 12 tends to be deformed since thermal expansion of the metallic body 3 enlarges. Therefore, the electronic part 11 is likely to peel off.

It is preferable that the arithmetic mean roughness Ra of the main surface of the metallic base body 2, opposite to the metal layer 4, is 30 μm or more (Ra≦30 μm). In general, the package for receiving the electronic part is connected with the heat radiating member A formed of the metal material such as aluminum or copper, or the ceramic material having high thermal conductivity, by means of screw, the molten metal such as a solder, or a lead. In doing so, when the arithmetic mean roughness Ra of the other surface of the metallic base body 2, opposite to the metal layer 4, is 30 μm or more (Ra>30 μm), it is hard to closely contact the package for receiving the electronic part with the heat radiating member A. Thus, a gap or a void is highly likely to be generated between the package for receiving the electronic part and the heat radiating member A. As a result, the heat generated from the electronic part 11 may not be efficiently transferred from the package for receiving the electronic part to the heat radiating member A. Accordingly, it is preferable that the main surface opposite to the metal layer 4, of the metallic base body 2 is flat for the sake of the close contact with the heat radiating member A.

Preferably, a coefficient of thermal expansion of the frame body 5 is 0.7~1.5 times as great as that of the metallic base body 2. Hence, since thermal expansion of the metal layer 4 to the frame body 5 and the metallic base body 2 can be successfully restricted with balance, the deformation of the package for receiving the electronic part can be avoided.

Preferably, the coefficient of thermal expansion of the frame body 5 is set to smaller than that of the metallic base body 2. In particular, the coefficient of thermal expansion of the frame body 5 is 0.7~0.9 times as great as that of the metallic base body 2. Thus, when the heat is transferred to the heat radiating plate 1 by heat generation of the electronic part 11, the frame body 5 having a smaller coefficient of thermal expansion than that of the metallic base body 2 can restrict thermal expansion of the metallic base body 2 toward the frame body 5. Then, the heat radiating plate 1 becomes convex to the opposite side of the metal layer 4, that is, is bent to protrude the center portion of the main surface opposite to the metal layer 4. Hence, the package for receiving the electronic part and the heat radiating member A can be in contact without gap. Consequently, the heat generated from the electronic part 11 can be effectively transferred to the heat radiating member A through the heat radiating plate 1.

Preferably, the thickness of the frame body 5 is smaller than that of the metallic base body 2. Then, heat transfer from the electronic part 11 to the heat radiating plate 1 can be smoothly carried out, and the compactness of the package for receiving the electronic part can be downsized by lowering its height. When the thickness of the frame body 5 is smaller than that of the metallic base body 2, after the heat radiating plate 1 is assembled, the heat radiating plate 1 can be bent such that the center portion of the main surface opposite to the mounting area 12 protrudes. The bending value, that is, the difference of elevation between the outer circumference and the vertex of the protrusion on the main surface opposite to the mounting area 12 of the heat radiating plate 1 can be regulated within 50 μm. Thus, it is possible to closely contact the heat radiating plate 1 to the heat radiating member A, and to radiate excellently the heat generated by the operation of the electronic part 11 to outside.

It is preferable that respective main surfaces of the metallic base body 2 and the metallic body 3 on opposite side of the metal layer 4 are exposed on the main surface of the heat radiating plate 1 on opposite side of the mounting area 12. Accordingly, heat generated from the electronic part 11 can be smoothly transferred to the heat radiating member A. As the main surfaces of the metallic base body 2 and the metallic body 3, opposite to the metal layer 4, are exposed, the metallic base body 2 and the frame body 5 having a smaller coefficient of thermal expansion are symmetrically disposed on either main surfaces of the metal layer having a larger coefficient of thermal expansion. Thus, balance of thermal expansion can be excellently maintained throughout the package for receiving the electronic part, and the deformation of the package for receiving the electronic part can be excellently restricted.

The main surfaces of the exposed metallic base body 2 and the exposed metallic body 3 may be coated with a film such as Ni or Au using the plating or the film deposition for the purpose of the corrosion prevention.

Figure 3:
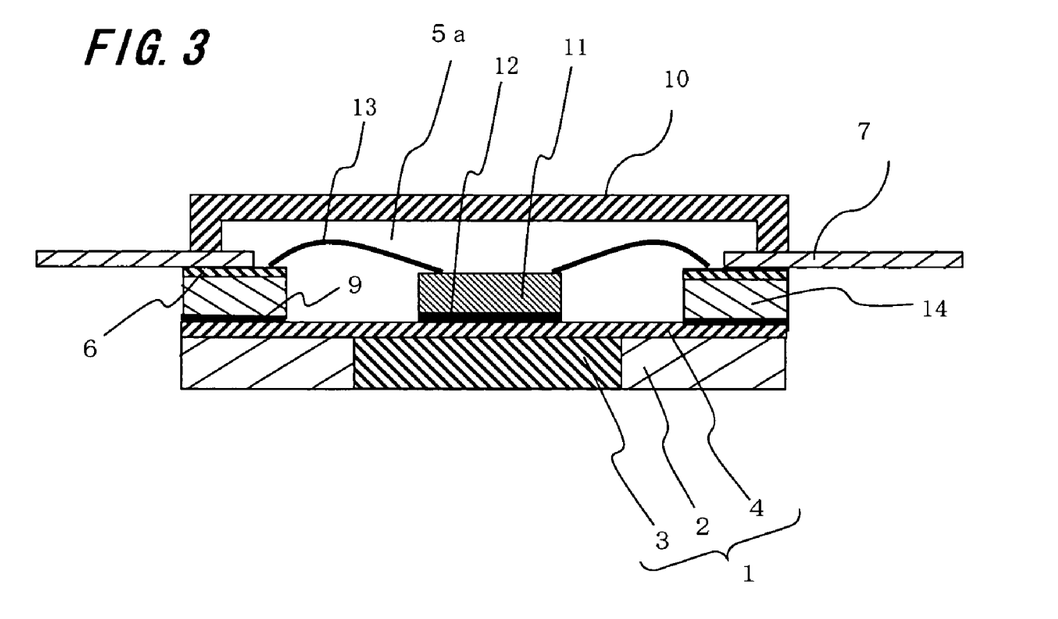
FIG. 3 is a cross sectional view illustrating a package for receiving electronic part and an electronic device according to the second embodiment of the present invention.
Figure 4:
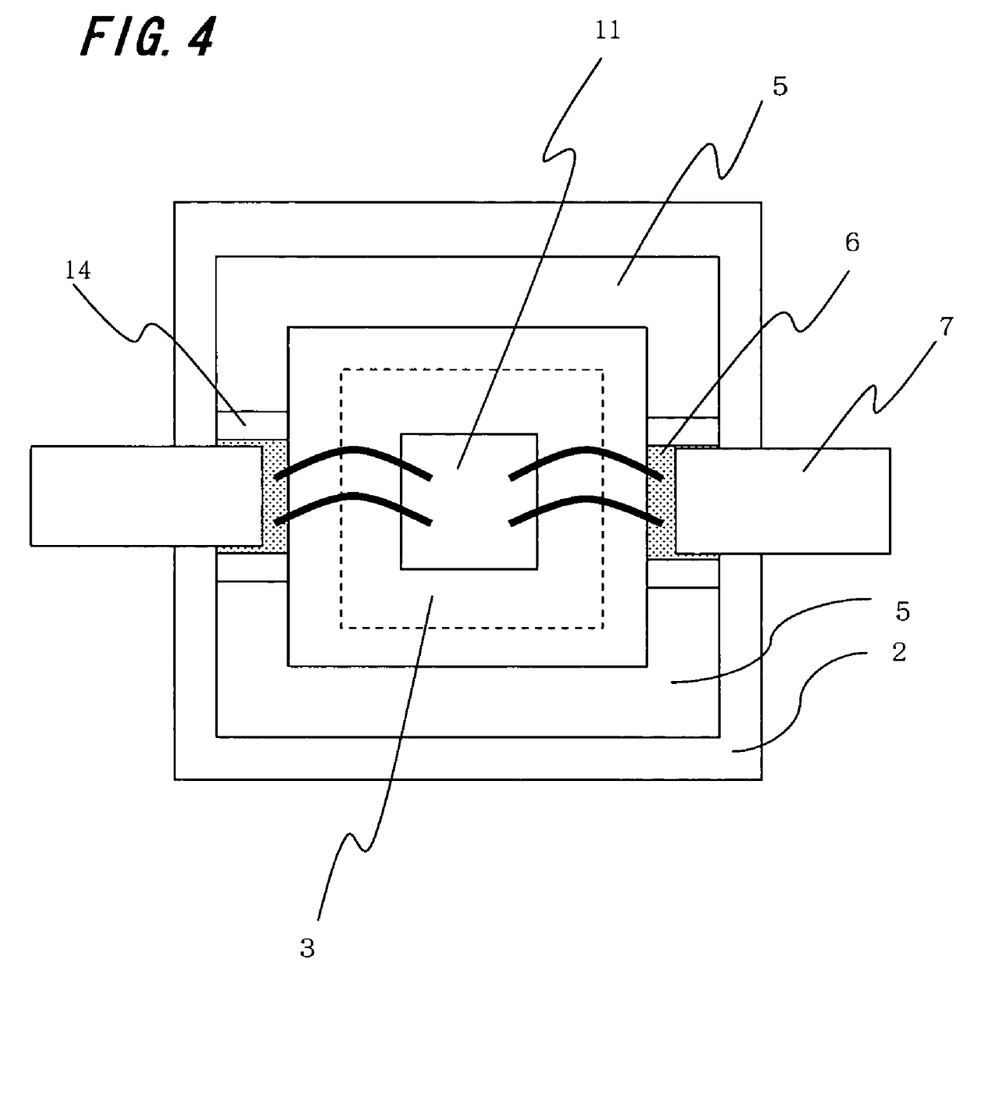
FIG. 4 is a plane perspective view of the package for receiving the electronic part of FIG. 3.

FIG. 3 is a cross sectional view showing a package for receiving electronic part by use of a frame body having conductivity, and an electronic device using the same according to another embodiment of the present invention, and FIG. 4 is a plane perspective view of the package for receiving the electronic part of FIG. 3.

In FIG. 3, the frame body 5 is formed of a metal such as Fe metal. A notch is formed to the frame body 5. An I/O terminal 14 formed of an insulting body having a wiring conductor 6 that is fabricated on or in the notch using the metallization, is inserted to and joined with the notch. Accordingly, shielding performance for the electronic part 11 can be enhanced.

As such, in the package for receiving the electronic part as above, the electronic part 11 is securely adhered to the mounting area 12 of the heat radiating plate 1 by means of an adhesive agent (not shown) formed of glass, resin, and solder, lead, and the like, and the electrode of the electronic part 11 is electrically connected with the certain wiring conductor 6 by means of the bonding wire 13. Next, the cover body 10 (preferably, the cover body 10 has high thermal conductivity in view of the heat radiation) formed of metal or insulating material is attached to the concave part 5a constructed by the heat radiating plate 1 and the frame body 5, so as to cover the mounting area 12. Thus, the electronic device is fabricated as product. Although the cover body 10 is the sealing member for sealing the electronic part 11, the sealing member may not be the cover body 10. For instance, the electronic part 11 can be sealed in the concave part 5a by filling the concave part 5a, configured by the heat radiating plate 1 and the frame body 5, with the sealing resin (not shown).

The electronic device, as shown in FIG. 5, is mounted on the heat radiating member A and electrically connected with an external circuit board or an external electronic device. Thus, an electronic system for supplying power or inputting and outputting electrical signals is constructed.

The heat radiating member A serves to radiate excellently the heat from a package for receiving the electronic part by mounting the package for receiving the electronic part of the present invention. For instance, the heat radiating member A is a metal plate consisting of aluminum or copper. As shown in FIG. 5, when an external circuit board B or an external electronic device is mounted on the heat radiating member A in addition to the package for receiving the electronic part, the heat radiating member A is also used as a board for performing the electrical connection.

It is advantageous that the electronic device of the present invention is mounted onto the heat radiating member A such that the main surfaces of the metallic base body 2 and the metallic body 3 of the electronic device of the present invention on opposite side of the metal layer 4, contact with the heat radiating member A. Then, the heat generated by the electronic part 11 can be normally transferred to the heat radiating member A to thus enhance the heat radiation. To facilitate the mounting of the electronic device to the heat radiating member A and improve the heat radiation, advantageously, the main surface of the metallic body 3 on opposite side of the metal layer 4 is directly contacted with the heat radiating member A.

To carry out heat transfer from the electronic device to the heat radiating member A with higher reliability, advantageously, a carbon sheet or grease is interposed between the main surface of the metallic body 3 on opposite side of the metal layer 4 and the heat radiating member A. Thereby, it is possible to effectively prevent the generation of gap between the metallic body 3 and the heat radiating member A, to transfer heat generated from the electronic part 11 to the heat radiating member A far more efficiently, and to improve the heat radiation reliability to the heat radiating member A.

It is preferred that the carbon sheet or the grease is interposed between the main surface of the metallic base body 2 on opposite side of the metal layer 4, and the heat radiating member A so as to far more improve the heat radiation.

As a means for fixing the electronic device of the present invention to the heat radiating member A, a screw is exemplified.

While the present invention has been particularly shown and described with reference to exemplary embodiments thereof, it will be understood by those skilled in the art that various changes in form and details may be made therein without departing from the spirit and scope of the invention. By way of example, to effectively radiate the heat generated by the electronic part 11 from the heat radiating plate 1 into the air, a heat radiating fin is connected to the main surfaces of the metallic base body 2 and the metallic body 3 of the heat radiating plate 1 on opposite side of the metal layer 4, or a heat radiating fin is joined using the soldering so that the heat radiating fin is integrally formed to the heat radiating plate 1. Accordingly, owing to the presence of the heat radiating fin, the heat generated by operation of the electronic part 11 can be absorbed to the heat radiating plate 1, and heat diffusion into the air can be improved.

Although a few embodiments of the present invention have been shown and described, it would be appreciated by those skilled in the art that changes may be made in these embodiments without departing from the principles and spirit of the invention, the scope of which is defined in the claims and their equivalents.

The invention claimed is:

1. An electronic device comprising:
an electronic part;
a package that receives the electronic part; and
a sealing member that seals the electronic part;
wherein the package comprises:
   a heat radiating plate having a surface including a mounting area where the electronic part is mounted;
   a frame body adhered to the surface surrounding the mounting area and defining an interior area of the package and an exterior area of the package; and
   a wiring conductor derived from the interior area to the exterior area;
wherein the heat radiating plate comprises:
   a metallic base body defining a hole located under the electronic part and mounting area;
   a metallic body filling inside of hole; and
   a metal layer on the metallic base body and the metallic body;
wherein the mounting area is located on the metal layer above the metallic body;
wherein both the metallic body and the metal layer have higher thermal conductivity than the metallic base body;
wherein both the frame body and the metallic base body have a smaller coefficient of thermal expansion than the metal layer;
wherein the electronic part is electrically connected with the wiring conductor; and
wherein an outer circumference of the metallic body is located outside of an outer circumference of the electronic part when the heat radiating plate is viewed in a plane perspective.

2. The electronic device of claim 1, wherein the electronic part is semiconductor elements.

3. The package for receiving the electronic device of claim 1, wherein the coefficient of thermal expansion of the frame body is smaller than that of the metallic base body.

4. The package for receiving the electronic device of claim 1, wherein thickness of the frame body is smaller than that of the metallic base body.

5. The package for receiving the electronic device of claim 1, wherein the metal layer is interposed between the metallic base body and the frame body.

6. The package for receiving the electronic device of claim 1, wherein a coefficient of thermal expansion of the frame body is 0.7-1.5 times as great as a coefficient of thermal expansion of the metallic base body.

7. The package for receiving the electronic device of claim 1, wherein the metallic base body includes tungsten or molybdenum.

8. The package for receiving the electronic device of claim 1, wherein the metallic body includes copper.

9. The package for receiving the electronic device of claim 1, wherein the frame body is formed of ceramic.

10. The package for receiving the electronic device of claim 1, wherein arithmetic mean roughness Ra of a main surface of the metallic base body on opposite side of the metal layer is 30 um or more (Ra<=30 um).

* * * * *